D.C.-A.C. TRANSISTOR AMPLIFIER

Filed Jan. 29, 1960 2 Sheets-Sheet 1

INVENTOR.
JOHN W. HIGGINBOTHAM.
BY
Earl C. Hancock
AGENT.

INVENTOR.
JOHN W. HIGGINBOTHAM.
BY
Earl C. Hancock
AGENT.

United States Patent Office 3,042,875

Patented July 3, 1962

3,042,875

D.C.-A.C. TRANSISTOR AMPLIFIER

John W. Higginbotham, Bel Air, Md., assignor to Martin-Marietta Corporation, a corporation of Maryland Filed Jan. 29, 1960, Ser. No. 5,545

11 Claims. (Cl. 330—17)

Figure 1:
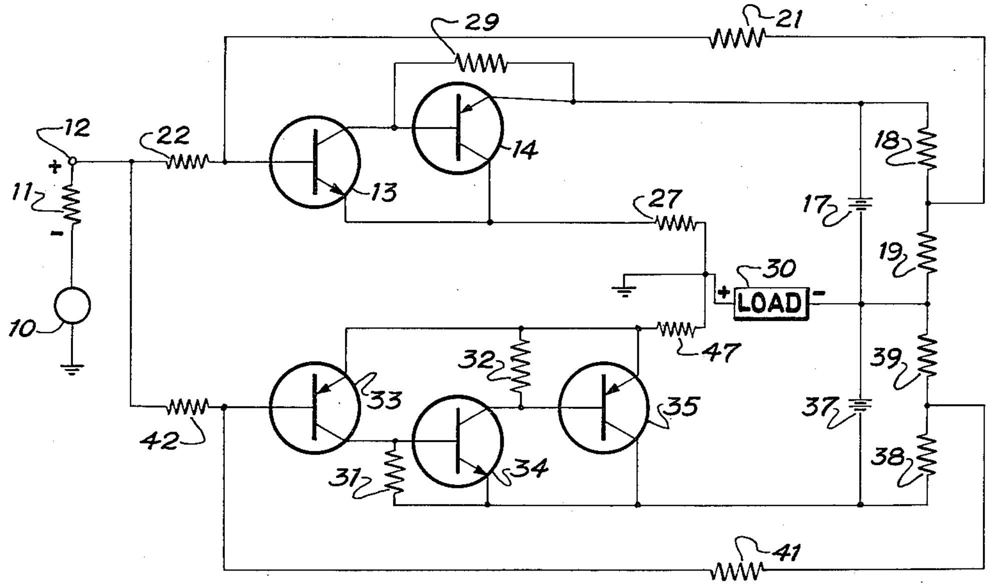

The present invention relates to transistor amplifiers capable of amplifying D.C. and A.C. signals, and more particularly to transistor amplifiers capable of supplying push-pull amplification for D.C. signals of either positive or negative polarity and A.C. signals over a wide dynamic range.

High fidelity and servo operations ideally require an amplifier that is capable of amplifying a wide range of A.C. signals and D.C. signals of both polarities, but presently available amplifiers have fallen short of fully meeting these requirements. In order to obtain a desirable level of output power and as much of the aforementioned amplification range as is possible, the presently known amplifiers have generally depended upon transformers to produce double-ended inputs and double-ended outputs which of course prevents amplification of D.C. signals.

The present invention makes available a power amplifier having possibly the widest range of applications known. This amplifier provides power for a load with the efficiency of class B amplification but without many of the limitations of currently available amplifiers such as the necessity of a load center-tap return. Wide impedance variations of the load employed will have little adverse effect upon the characteristics of this amplifier since multiple feedback loops are utilized to sense variations of both voltage and current in the load so as to maintain a relatively constant output power for a given input power from a signal source. The present amplifier could be used to drive resistive loads (such as heaters), resistive-inductive loads, acoustic transducers, torque converter loads (such as stall torque motors in gyros), D.C. motors, loudspeakers, or any of a wide variety of applications which are readily apparent when the characteristics of the present amplifier are known. In addition, there is no polarity restriction in the present amplifier for any of the utilizations therefor.

The amplifier according to the present invention comprises two parallel transistor amplifier sections that are fed by a common, single-ended input circuit, are interconnected by a differential feedback system, and feed a common single-ended load. This amplifier advantageously employs resistive elements for separate current and voltage feedback systems to linearly control the output power of the amplifier so as to effectively remove the characteristics of the transistors from the overall amplification operation. In particular, each amplifier section has its own resistive elements incorporated therein so as to form a current feedback loop that controls the current gain of the particular amplifier section associated therewith as a function of the ratio of the resistive elements used. The voltage feedback for each amplifier section is a function of the ratio of a resistive element and the common load resistance so that the voltage feedback causes the voltage gain to vary directly with any variation of load resistance while the current feedback causes the current gain to vary inversely with variations in load resistance. Thus by controlling the voltage and current gains, the output power gain remains constant. The derivation of these feedback ratios will be explained in connection with the appended detailed description.

In addition, non-linear gain degeneration is incorporated in the stages of the amplifier in order to overcome distortion resulting from leakage current amplification. This can be done by advantageously feeding back the internal non-linear characteristics of each transistor or by adding external non-linearity, the latter being especially useful where it is necessary or desirable to utilize transistors having relatively high leakage currents as is the case for a considerable number of germanium transistors in particular. By using non-linear stabilization, the amplifier can be made to be relatively stable with temperature, and I have described such stabilization in detail in my copending application Serial No. 756,920, entitled "Transistor Circuits," filed August 25, 1958. However, external non-linear resistors need not always be used for most silicon and some germanium transistors that are currently available. For these transistors, the product of the collector-to-base leakage current ($I_{cbo}$) and the resistances between the emitter and base ($R_{eb}$) is much less than the threshold voltage of the transistor at the leakage current ($V_t$). Expressed mathematically:

$$I_{cbo} \times R_{eb} << V_t$$

The foregoing condition is more easily satisfied for most silicon transistors since $I_{cbo}$ is generally lower and the threshold voltage is always higher (approximately .5 volt in many cases) as compared to germanium transistors. Therefore, as long as the emitter-base resistance ($R_{eb}$) is small enough to satisfy the aforementioned mathematical relation, the transistors will supply their own non-linear stabilization.

The present amplifier is preferably biased for class B operation to obtain the greatest amount of output power but it could just as well be operated in class A if it should be desirable to cancel some harmonics and to increase linearity. However, class B biasing has been found to provide excellent results for many applications including high fidelity sound reproduction which is better than that available from any known amplifier having a comparable power range.

Furthermore, the present amplifier can be readily modified to include capacitive elements to provide increased ripple feedback by presenting a low impedance to the ripple frequencies which will allow a greater amount of ripple voltage to be fed back than would have been done by using only resistances. Thus, the amplifier has the unique capability of providing its own voltage regulation which of course permits the utilization of an economical, reliable, unregulated and lightly filtered power supply without any appreciable sacrifice of fidelity or power output.

The present invention represents a considerable advance in the electronics industry in that it makes available an amplifier that has no polarity restrictions for D.C. signals, is capable of high fidelity and high power amplification of signals from D.C. through a wide frequency range of A.C., does not have the design problems and limitations of input and output transformers, can be made relatively independent of transistor parameters and the regulation of the power supply used, and has an extremely wide variety of applications.

Figure 2:
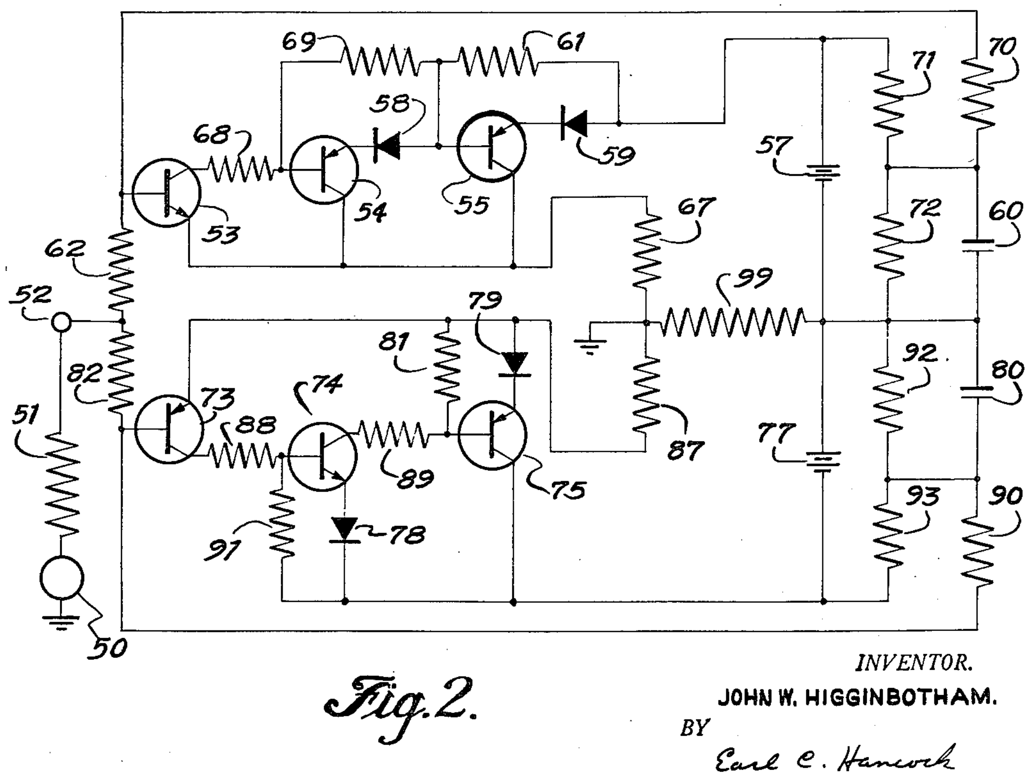
Figure 3:
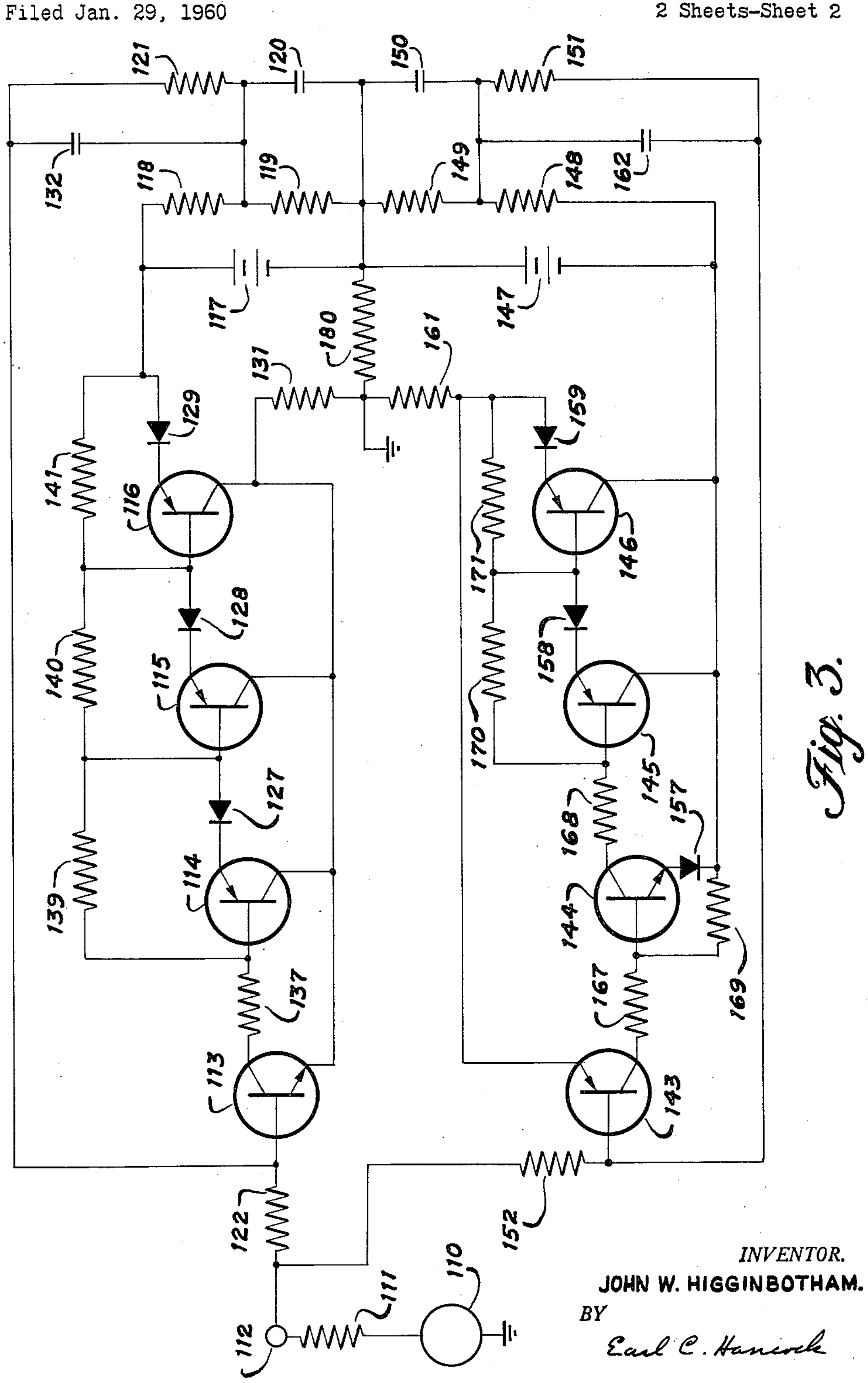

The novel features that are considered characteristic of this invention are set forth with particularity in the appended claims. The invention itself, however, both as to its organization and method of operation as well as additional features and advantages thereof will be best understood from the following description when read in connection with the accompanying drawings in which:

FIGURE 1 is a schematic diagram of an amplifier in accordance with this invention; and FIGURE 2 is a schematic diagram of another embodiment of this invention including external temperature stabilization and voltage regulation features; and FIGURE 3 is a schematic diagram of another embodiment of this invention for producing relatively high output power at relatively high frequencies.

The invention may best be described by referring to FIGURE 1 in which it is illustrated as a relatively simple five transistor amplifier. A source of input signals 10 having an internal resistance 11 is shown connected between amplifier input terminal 12 and a common voltage reference which is illustrated as a ground connection in FIGURE 1. The amplifier for purposes of description can be considered as being roughly divided into two parallel amplifier sections, one section including amplifier transistors 13 and 14, and the other section including amplifier transistors 33, 34, and 35, transistors 13 and 34 being shown as NPN transistors and the others as PNP transistors for purposes of illustration. In addition, power supplies 17 and 37 are connected to the first and second amplifier sections respectively so as to provide emitter-collector current therefor. A voltage divider network comprising resistors 18 and 19 is paralleled with power supply 17, and the value of resistors 18 and 19 is selected to provide a D.C. bias potential for establishing the operating point for the first amplifier section, which bias potential is connected through feedback resistor 21 to the base of transistor 13. The actual operating bias is developed as a single-sided feedback across resistor 22. A similar function is performed for the other amplifier section by divider resistors 38 and 39, feedback resistor 41, and resistor 42. The bias circuits are both completed by the input impedance 11 of the input signal source 10. The operating bias that is produced is determined by the requirements that are to be met by the amplifier and, for instance, could be class B for efficiency, good fidelity and high power or class A for minimum distortion but lower output power and efficiency.

Each stage of amplification for the amplifier is D.C. coupled to the preceding and/or succeeding stage. That is, the collector of transistor 13 is D.C. coupled to the base of transistor 14 for the first amplifier section, and for the second amplifier section, the collector of transistor 33 is D.C. coupled to the base of transistor 34, the collector of 34 then being D.C. coupled to the base of transistor 35. The resistors 29, 31 and 32 are connected in the emitter-base circuit of transistors 14, 34 and 35, respectively, and are selected so as to control the leakage current gain thereof. These resistors restore the non-linearity of their associated transistor amplifier stages by feeding back the impedance non-linearity of the emitter-base junction. In other words, the presence of one of these resistors in the stage associated therewith allows the non-linear impedance characteristics of the transistor to be reflected to the input thereof so that the current gain of this stage will have a non-linear characteristic thereby "restoring" the impedance non-linearity to a circuit gain non-linearity. The transistor is then a predictable non-linear current amplifier allowing it to be used to decrease the undesirable amplification of the collector leakage currents between stages. Linearity is restored to the overall amplifier operation by the multiple feedback loops formed by resistances 21, 22, and 27 for the first amplifier section and resistances 41, 42 and 47 for the second amplifier section. Thus the internal gain can change allowing control of leakage current amplification while the external characteristics of the amplifier are held constant. The output load 30 or utilization circuit for the amplifiers is connected between the junction of power supplies 17 and 37 and the common voltage reference which is ground in this illustration.

Included in the emitter-collector circuit for transistors 13 and 14 is dynamic feedback resistor 27 and similarly dynamic feedback resistor 47 is included in the emitter-collector circuit for transistors 33, 34 and 35. Resistors 27 and 47 will develop voltages that are fed back to their associated amplifier section which causes a current to flow into the bases of transistors 13 and 33 respectively and which is mixed differentially in the source impedance 11. Thus resistors 27 and 47 control voltage feedback circuits that are effectively both single-sided and differential. From the foregoing, it can be seen that the voltage gain for the amplifier is determined by resistors 27 and 47 in conjunction with the other circuitry associated therewith. When no input signal is present, the voltage that is fed back by resistor 27 is approximately equal to the bias voltage developed by the two divider circuits comprising resistors 18 and 19 and resistors 21 and 22, although it should be noted that the voltage feedback will vary during normal operation of the amplifier while the operating bias will remain constant. The foregoing is also true for the other amplifier section of course for resistor 47 and the divider circuits comprising resistors 38 and 39 and resistors 41 and 42.

The no-signal current flow through load circuit 30 as a result of the drift current from the transistors of one of the amplifier sections will tend to increase the forward bias of the other amplifier section so as to increase the gain thereof. As a result, there is a substantially constant drift current compensation that automatically balances the no-signal voltage across the load circuit 30 at zero. For example, assume that the amplifier section including transistors 13 and 14 should develop a drift current that would create an out-of-balance condition between the two amplifier sections. This drift current would cause a potential drop across resistor 27 that would be fed directly back to the base of transistor 13 as inverse feedback therefor. In addition, the drift current would cause a potential drop across load circuit 30 which would in turn be fed back through both feedback resistors 21 and 41 thereby boosting the gain of the amplifier section including transistors 33, 34 and 35 as well as further reducing the gain of the other amplifier section until the balanced condition is substantially restored. In effect, this means that the overall circuit gain is reduced in exchange for a predictable, stable and linear amplification operation. Thus undesired current gain will be canceled out by effectively increasing the gain of the opposing amplifier section while decreasing the gain of the amplifier section producing the drift current.

If a positive D.C. voltage is applied across the source impedance 11 by the input source 10 as is illustrated in FIGURE 1, the current through transistor 13 will increase while the current through transistor 33 will decrease. However, part of the positive D.C. input signal will be canceled as a result of the output current flow through resistor 27 and the voltage across the load circuit 30 which is fed back through resistors 19, 21 and 22 so that the overall circuit gain is thereby reduced. This means in effect that there are three input current components to the base of transistor 13, one component being from the input signal, a second component being from the voltage developed across feedback resistor 27 and the third component being from the potential developed across load circuit 30. It should be apparent that for class B operation the feedback current developed from the potential drop across load 30 will be single-ended if one of the two amplifier sections is being driven into non-conduction by the input signal. The differential feedback action from the load potential occurs when the input signal is substantially at zero or if the amplifier is being operated in class A.

The output potential developed across load circuit 30 will be negative as is also illustrated in FIGURE 1 but will be amplified in proportion to the input voltage as long as the input voltage is supplied to the circuit. Thus it can be seen that the amplifier of this invention has an inherent phase reversal characteristic. Therefore, for negative input signals, transistors 33, 34 and 35 would conduct, and the output voltage would appear across load circuit 30 as an amplified positive voltage thereby producing signal polarities opposite those actually illustrated in FIGURE 1. Furthermore, the analysis of the amplifier for A.C. signals is very similar to the aforementioned D.C. analysis in that A.C. signals can be considered to be D.C.

signals for any given instant The positive swing of an A.C. signal would be amplified by the amplifier section that includes transistors 13 and 14, and would appear shifted by 180° across the output load 30.

In effect, the amplifier of this invention advantageosuly utilizes feedback loops to control the current gain and the voltage gain thereof so as to effectively maintain the output power in proportion to the input signal power. The input impedance of this amplifier is varied by the feedback loops, and this can best be seen by considering the following mathematical analysis:

It is known that:

$$E_o = R_l \times B \times i_b$$

and:

$$E_{in} = R_{in} \times i_b$$

where:

$E_o$=output voltage
$R_l$=load resistance 30
$B$=amplifier current gain
$i_b$=input current
$E_{in}$=input voltage
$R_{in}$=amplifier input impedance Also, the amplifier current gain ($G_i$) may be expressed:

$$G_i = \frac{1}{\frac{1}{B} + \frac{R_l}{R_{fb}}}$$

where: $R_{fb}$=feedback resistance or resistors 21 or 41. It should be noted that the impedances of divider circuits comprising resistors 18 and 19 and resistors 38 and 39 can either be neglected entirely if they are of sufficiently small magnitude with respect to resistors 21 or 41, or alternatively they can be considered as lumped with resistors 21 or 41.

If:

$$\frac{R_l}{R_{fb}} \gg \frac{1}{B}$$

$$(1) \quad G_i' = \frac{R_{fb}}{R_l} = B' \text{ (apparent current gain)}$$

The voltage gain ($G_v$) for unstabilized amplifiers is:

$$(2) \quad G_v = \frac{R_l \times B}{R_{in}}$$

Substituting Equation 1 in Equation 2:

$$(3) \quad G_v \cong \frac{R_l \frac{R_{fb}}{R_l}}{R_{in}} \text{ (with current feedback)}$$

$$(4) \quad R_{in}' = R_{in} + G_i \times R_{vb}$$

where: $R_{vb}$= voltage feedback resistance or resistors 27 or 47

$$R_{in}' = \frac{E_{in}}{i_b}$$

To show the validity of Equation 4, consider the following:

$$E_{in} = i_b(R_{in} + R_{vb}) + i_c R_{vb}$$

where:

$$i_c = G_i \times i_b$$

then:

$$E_{in} = i_b(R_{in} + R_{vb}) + G_i(i_b R_{vb})$$
$$= i_b(R_{in} + R_{vb} + G_i R_{vb})$$

Since $R_{in}'$ represents the apparent input impedance, or $$R_{in}' = \frac{E_{in}}{i_b}$$

Therefore, when $G_i >> l$:

$$R_{in}' = \frac{E_{in}}{i_b} = R_{in} + (G_i + 1) R_{vb}$$

$$R_{in}' \cong R_{in} + G_i R_{vb}$$

Substituting Equation 1 in Equation 4:

$$(5) \quad R_{in}' = R_{in} + \frac{R_{fb}}{R_l} \times R_{vb}$$

If $$\frac{(R_{fb} \times R_{vb})}{R_l}$$

is made to be much greater than $R_{in}$, then:

$$(6) \quad R_{in}' \cong \frac{R_{fb} \times R_{vb}}{R_l}$$

Thus, with both the current and voltage feedback loops:

$$(7) \quad G_v \cong \frac{R_{fb}}{\frac{R_{fb} \times R_{vb}}{R_l}} = \frac{R_l}{R_{vb}}$$

From this it can be seen that the amplifier voltage gain will vary directly with variations in the load and is degeneratively controlled by the value of the voltage feedback resistors 27 and 47.

$$\text{Power gain} \cong G_v' \times G_i' = \frac{R_l}{R_{vb}} \times \frac{R_{fb}}{R_l} = \frac{R_{fb}}{R_{vb}}$$

which shows a power gain relatively independent of $R_l$ and the transistor parameters.

The circuit shown in FIGURE 2 is a modification of FIGURE 1 which is capable of a generally greater power handling capacity and which includes additional circuit elements for providing greater temperature stabilization and voltage regulation. Many aspects of the circuit shown in FIGURE 2 operate in a similar manner as their counterparts in FIGURE 1 and a description thereof will be omitted for FIGURE 2 for purposes of clarity.

The amplifier according to FIGURE 2 can be used with a power supply that has poor regulation and little filtering which means that a relatively large amount of ripple voltage can be tolerated. For this purpose, capacitors 60 and 80 are connected across divider resistors 72 and 92. These capacitors are designed to present a low impedance to the power supply ripple frequency as seen by load 99 and therefore a greater amount of ripple voltage will be fed back than would have been provided by the purely resistive divider networks in parallel with power supplies 57 and 77. However, it should be noted that considerable ripple cancellation can be realized for many uses of the amplifier without the inclusion of capacitors 60 and 80. By including capacitors 60 and 80, the amplifier is functioning as an amplifier and a voltage regulator at the same time. Therefore the power supplies that are required can be built very simply, economically, and will be more reliable as a result since no regulation and only a small amount of filtering is necessary.

If the transistors used in each amplifier section in FIGURE 2 are of a generally poor quality, resistors 61 and 81 can be replaced with thermistors to track a portion of the collector leakage cut-off current so as to produce a biasing effect in the emitter-base circuits of transistors 55 and 75 respectively to further prevent these transistors from amplifying their leakage currents. In addition, the emitter circuits of transistors 54, 55, 74 and 75 include stabistor elements 58, 59, 78 and 79 respectively to provide leakage current compensation external to the transistors by non-linearly degenerating the gain of each of these stages. The resistance of the stabistors varies exponentially with the current therethrough and will produce bias potential for each stage to control the gain thereof by an inverse ratio. That is to say, when no input signal is applied to the amplifier, the stabistor resistances are high and therefore the current gain of an individual stage approaches unity. Thus the non-linear characteristics of the stabistors are herein employed enables the transistors to have a variable gain characteristic as a function of their collector current level for a portion of the output range. As the current level increases, the transistors approach the normal gain characteristic of an unstabilized transistor. Linearity is restored to the overall amplifier by the feedback voltages developed by resistors 67 and 87 as described in connection with FIGURE 1. By this means, the amplifier can be made to be stable for large temperature variations. As was noted in FIGURE 1, the circuit of FIGURE 2 can be made to operate without stabistor elements 58, 59, 78, and 79 if the transistors used are such that the product of the collector-to-base leakage current is less than the threshold voltage at the leakage current. Resistors 68, 88, and 89 are included in the collector circuits of transistors 53, 73, and 74 respectively to provide saturation limiting for large input signals. Obviously if no large input signals are anticipated, resistances 68, 88, and 89 can be omitted.

The operation of the amplifier shown in FIGURE 2 is similar to the operation of the amplifier of FIGURE 1 in that positive D.C. input signals or positive A.C. excursions are amplified by the amplifier section comprising transistors 53, 54, and 55, and negative D.C. signals or negative A.C. excursions are amplified by the amplifier section comprising transistors 73, 74, and 75. The amplified input signal will appear at the load circuit 99 with a phase reversal.

One amplifier constructed in accordance with the diagram shown in FIGURE 2 was designed to operate from a source impedance of approximately 10K ohms or less and used a combination comprising the following circuit parameters.

| Elements: | Value or type |
|---|---|
| **53** | 2N385 (Sylvania). |
| **54** | 2N325 (Sylvania). |
| **55, 75** | 2N174A (Delco). |
| **73** | 2N525 (General Electric). |
| **74** | 2N326 (Sylvania). |
| **58, 78** | SG22 (Transitron). |
| **59, 79** | SM72 (Transitron). |
| **60, 80** | 20 μfd. (Electrolytic). |
| **61, 81** | 220 ohms (ambient) (Keystone Thermistors). |
| **62, 82** | 2.7K ohms. |
| **67, 87** | 1 ohm, 5 watts. |
| **68** | 100 ohms. |
| **69, 91** | 270 ohms. |
| **70, 90** | 39K ohms. |
| **71, 93** | 4.7K ohms. |
| **72, 92** | 1.5K ohms. |
| **88** | 68 ohms. |
| **89** | 10 ohms. |

This amplifier has been successfully operated into load circuits ranging from 1 ohm to 100 ohms although this does not represent the operational limits of the amplifier. With power supplied by a dual 15 volt power supply, one amplifier in accordance with FIGURE 2 utilizing the above-mentioned circuit parameters and an 8 ohm load produced 5 watts of output power or approximately 40 db gain within a tolerance of 1 percent from D.C. through 25 kilocycles.

The circuit shown in FIGURE 3 is another arrangement according to this invention and which illustrates the appropriate circuitry for cascading stages of amplification in each of the amplifier sections in order to produce a higher level of output power for a wider frequency range than the circuits of FIGURES 1 and 2. That is, the amplifier of FIGURE 3 contains not only driver amplifier stages 113 and 143 but three stages of cascaded amplification thereafter in the form of transistors 114, 115, 116 and 144, 145, 146 for the first and second amplifier sections respectively. It should be noted in all cases with exception of the driver stages 113 and 143, and the final output stages 116 and 146, that the emitter-base circuit of the cascaded amplifier sections is isolated from (that is not directly connected to) dynamic feedback resistors 131 and 161. Furthermore, transistors 114, 115, 116, 144, 145 and 146 may all be non-linear gain stabilized externally by the addition of stabistor elements 127, 128, 129, 157, 158, and 159, as shown and in the manner described hereinbefore if this is desirable. In view of the higher output power and possibly larger accumulated leakage currents, however, a larger amount of non-linear stabilization generally should be supplied for the final amplifier stage as compared to the preceding stage or stages. Capacitors 132 and 162 are also included in the circuit shown in FIGURE 3 to provide a lower impedance feedback path for higher operating frequencies and to prevent high frequency oscillation from occurring. That is, high-power signals above the desired operating range of frequencies are cancelled by the inverse feedback of capacitors 132 and 162 to prevent excessive junction heating from occurring.

One amplifier built in accordance with the diagram of FIGURE 3 has been found to be applicable for a large variety of operations. This particular amplifier was operated with 2 milli-watts of input power from a source of approximately 10K ohms or less, and delivered 10 watts of output power to a load of approximately 10 ohms within 1 percent tolerance from D.C. through 25 kilocycles. The 3 db point of this amplifier was found to be at 40 kilocycles with respect to 1 kilocycle. Hum and noise was found to be 82 db down when using a 60 cycle supply and 84 db down when using a 400 cycle supply, both of these figures being obtained with a full-wave unregulated dual 15 volt power supply using 3000 μfd. electrolytic capacitors across each output section of the power supply. The actual circuit parameters used were.

| Element: | Value or type |
|---|---|
| **113** | 2N167 (General Electric). |
| **114, 143** | 2N525 (General Electric). |
| **115, 145** | 2N1043 (Texas Instrument). |
| **116, 146** | 2N174A (Delco). |
| **118, 148** | 4.7K ohms. |
| **119, 149** | 1.5K ohms. |
| **120, 150** | 20 mfd. (Electrolytic). |
| **121, 151** | 39K ohms. |
| **122, 139, 152, 169** | 2.7K ohms. |
| **127, 157** | SG22 (Transitron). |
| **128, 158** | PS405 (Pacific Semiconductor). |
| **129, 159** | SM72 (Transitron), two connected in series. |
| **131, 161** | 1 ohm. |
| **132, 162** | 100 mmfd. |
| **137, 170** | 100 ohms. |
| **140** | 150 ohms. |
| **141, 171** | 39 ohms. |
| **167** | 68 ohms. |
| **168** | 10 ohms. |

It is important that the relative conductivity of the transistors be maintained as shown and described but it is obviously within the scope of this invention that the conduction characteristic of all the transistors can be reversed provided of course that the polarity for each power supply and electrolytic capacitor is also reversed. The particular circuits delineated were designed for class B push-pull amplification but class A operation could be realized by simply increasing the value of resistors 19 and 39 in FIGURE 1, 72 and 92 in FIGURE 2, or 119 and 149 in FIGURE 3.

The particular structures disclosed in FIGURES 2 and 3 were found to be capable of producing 10 watts and 20 watts of output power respectively when only D.C. input signals were introduced. In addition, an A.C. input signal can be stopped and maintained at any amplitude or power level including the peaks thereof, and the output power level of this amplifier will remain constant in proportion to the aforementioned input power level without dropping off as would occur in most other A.C. amplifiers.

The amplifier circuits shown and described hereinbefore are intended as being exemplary only and the invention is not intended to be strictly limited thereto. There are many variations of the circuits shown within the spirit of this invention, these variations being dictated by the circuit elements available and the requirements to be met by the amplifiers.

What is claimed is:

1. An amplifier capable of amplifying A.C. signals and D.C. signals of either polarity from a signal source comprising, first and second amplifier sections, first and second power source means connected to supply operating power to said first and second amplifier sestions respectively, first and second bias circuit means connected in parallel with said first and second power source means respectively to produce constant operating bias for said amplifier section associated therewith, first and second feedback circuit means coupling said operating bias to the input of said first and second amplifier sections respectively, said first amplifier section including first and second transistors of first and second conductivity types respectively, said second conductivity type being opposite that of said first conductivity type, said second amplifier section including third, fourth, and fifth transistors of said second, first, and second conductivity types respectively, first and second input resistances connected for coupling signals from said signal source into the input of said first and third transistors respectively, said second and fourth transistors being connected to receive and amplify the output signals of said first and third transistors respectively, said fifth transistor being connected to receive and amplify the output signals of said fourth transistor, both said amplifier sections being biased such that input signals introduced to said amplifier from said signal source will be predominantly amplified by said first amplifier section when of a first polarity while said second amplifier section will predominantly amplify said input signals of a second polarity opposite said first polarity, a load circuit, the output circuits of said first and second amplifier sections including first and second resistive elements respectively said first and second resistive elements being connected at a common point, said load circuit being connected to said common point, said first and second resistive elements providing inverse D.C. feedback to said first and second amplifier sections respectively so as to maintain the no-input-signal condition across said load circuit substantially at zero and to provide feedback to bias said amplifier sections during amplification of A.C. input signals, whereby input signals of said first and second polarities will appear across said load circuit as amplified by said first and second amplifier sections respectively in proportion to the input power thereto.

2. An amplifier capable of amplifying D.C. signals of either polarity and A.C. signals over a wide dynamic range comprising, a first circuit point, an input signal source connected between said first circuit point and a common voltage reference, a first amplifier section including first, second, and third transistors each having at least base, emitter and collector electrodes, said first transistor being of a first conductivity type and said second and third transistors being of a second conductivity type opposite said first conductivity type, said first transistor having the base electrode thereof resistively connected to said first circuit point and the collector electrode thereof coupled to the base electrode of said second transistor, the emitter electrode of said second transistor being coupled to the base electrode of said third transistor, a first resistive element commonly connected on one side to the emitter electrode of said first transistor and the collector electrodes of said second and third transistors, the other side of said first resistive element being connected to said common voltage reference, a second circuit point, a first power source connected on one side to said second circuit point and on the other side to the emitter electrode of said third transistor so as to supply collector current for said first amplifier section, load circuit means connected between said second circuit point and said common voltage reference, first bias means connected across said first power source, a second resistive element connected to couple the bias potential from said first bias means to the base electrode of said first transistor, a second amplifier section including fourth, fifth and sixth transistors each having at least a base, emitter, and collector electrodes, said fourth and sixth transistors being of said second conductivity type and said fifth transistor being of said first conductivity type, the base electrode of said fourth transistor being resistively connected to said first circuit point, the collector electrodes of said fourth and fifth transistors being coupled to the base electrode of said fifth and sixth transistors respectively, a third resistive element commonly coupled on one side to the emitter electrodes of said fourth and sixth transistors, the other side of said third resistive element being connected to said common voltage reference, a second power source connected on one side to the collector electrode of said sixth transistor and the emitter electrode of said fifth transistor, the other side of said second power source being connected to said second circuit point thereby supplying collector current for said second amplifier section, second bias means connected across said second power source, a fourth resistive element connected to introduce said second bias means to the base electrode of said fourth transistor, the current gain of said first amplifier section being directly proportional to the ratio of said second resistive element and the resistance of said load circuit means and the voltage gain thereof being proportional to the ratio of said first resistive element and the resistance of said load circuit means, the current gain of said second amplifier section being directly proportional to the ratio of said fourth resistive element and the resistance of said load circuit means while the voltage gain thereof is proportional to the ratio of said third resistive element and the resistance of said load circuit means, so that input signals of any polarity will appear amplified across said load circuit means.

3. An amplifier in accordance with claim 2 which includes fifth, sixth, seventh and eighth resistive elements connected between the base and emitter electrodes of said second, third, fifth and sixth transistors respectively for feeding back signals to the inputs thereof proportional to the impedance non-linearity of the emitter-base junctions of said second, third, fifth and sixth transistors.

4. An amplifier in accordance with claim 3 which includes first, second, third and fourth stabistor elements connected in the emitter circuit of said second, third, fifth and sixth transistors respectively so as to provide leakage current compensation for said transistors by non-linearly degenerating the gain thereof, resistive means for preventing said transistors from saturation limiting during the application of large input signals, and first and second capacitive elements connected to provide low impedance feedback paths at ripple frequencies between the base electrodes of said first and fourth transistors respectively and said second circuit point.

5. An amplifier in accordance with claim 3 wherein the resistances of said second and fourth resistive elements are substantially equal, and the resistances of said first and third resistive elements are substantially equal, the current gain and the voltage gain of said amplifiers being substantially defined by $$G_i=\frac{R_{fb}}{R_l}$$

and $$G_v=\frac{R_l}{R_{vb}}$$

respectively, where:

$R_{fb}$=a resistance equivalent in magnitude to the resistance of either said second or fourth resistive element, $R_l$=the resistance of said load circuit means, $R_{vb}$=a resistance equivalent in value to the resistance of either said first or third resistive element, whereby the power gain for said amplifier is relatively independent of the parameters of said transistors and variations in the impedance of said load circuit means.

6. An amplifier capable of amplifying D.C. signals of either polarity and A.C. signals over a wide dynamic range comprising, a first circuit point, an input signal source connected between said first circuit point and a common voltage reference, a first amplifier section including first, second, third and fourth transistors, a second amplifier section including fifth, sixth, seventh and eighth transistors, all of said transistors having at least base, emitter and collector electrodes, said first and sixth transistors being of a first conductivity type and said second, third, fourth, fifth, seventh and eighth transistors being of a second conductivity type opposite said first conductivity type, first and second resistive coupling means connecting the base electrode of said first and fifth transistors respectively to said first circuit point, the collector electrode of said first and fifth transistors being direct coupled to the base electrode of said second and sixth transistors respectively, said sixth transistor having the collector electrode thereof direct coupled to the base electrode of said seventh transistor, the emitter electrode of said second, third and seventh transistors being coupled to the base electrode of said third, fourth and eighth transistors respectively, first, second, third, fourth, fifth and sixth resistive elements connected between the base electrode and the emitter electrode of said second, third, fourth, sixth, seventh and eighth transistors respectively for providing feedback of the impedance non-linearity at the emitter-base junctions thereof to the input associated therewith, a seventh resistive element connected on one side to said common voltage reference and on the other side to the emitter electrode of said first transistor and the collector electrodes of said second, third, and fourth transistors for providing inverse feedback for said first amplifier section, an eighth resistive element connected on one side to said common voltage reference and on the other side to the emitter electrodes of said fifth and eighth transistors for providing inverse feedback for said second amplifier section, a second circuit point, load circuit means connected between said second circuit point and said common voltage reference, first and second power source means connected on one side to said second circuit point, the other side of said first power source means being connected to the emitter electrode of said fourth transistor and the other side of said second power source means being commonly coupled to the emitter electrode of said sixth transistor and the collector electrodes of said seventh and eighth transistors, first and second divider circuit means connected in parallel with said first and second power source means respectively so as to produce operating bias potentials, ninth and tenth resistive elements connected on one side to said first and second divider circuit means respectively and on the other side to the base electrode of said first and fifth transistors respectively so as to introduce operating bias potentials to said amplifier sections, whereby input signals of a first polarity will be amplified and introduced to said load circuit means predominantly by said first amplifier section and input signals of a second polarity opposite said first polarity will be amplified and introduced to said load circuit means predominantly by said second amplifier section.

7. An amplifier in accordance with claim 6 wherein the resistances of said ninth and tenth resistive elements are substantially equal, the resistances of said seventh and eighth resistive elements are substantially equal, and the current gain and the voltage gain of said amplifier are substantially defined by $$G_i=\frac{R_{fb}}{R_l}$$

and $$G_v=\frac{R_l}{R_{vb}}$$

respectively where:

$R_{fb}$=a resistance equivalent in value to the resistance of either said ninth or tenth resistive element, $R_l$=the resistance of said load circuit means, and $R_{vb}$=a resistance equivalent in value to the resistance of either said seventh or eighth resistive element, whereby the power gain of said amplifier for a given input power will remain constant and relatively independent of the parameters of said transistors and variations in the impedance of said load circuit means.

8. An amplifier in accordance with claim 7 which includes first, second, third, fourth, fifth and sixth stabistor elements connected in the emitter circuit of said second, third, fourth, sixth, seventh and eighth transistors respectively so as to provide leakage current compensation for said transistors by non-linearly degenerating the gain thereof, resistive means for preventing said transistors from saturation limiting during the application of large input signals, and first and second capacitive elements connected on one side to the base electrodes of said first and fifth transistors respectively and on the other side to said second circuit point for providing low impedance feedback paths at ripple frequencies of said power source means.

9. An amplifier capable of amplifying D.C. signals of either polarity and A.C. signals over a wide dynamic range comprising, a first circuit point, an input signal source connected between said first circuit point and a common voltage reference, first and second driver sections, said first driver section including a first transistor of a first conductivity type having the base electrode thereof resistively coupled to said first circuit point, said second driver section including a second transistor of a second conductivity type opposite said first conductivity type and a third transistor of said first conductivity type, said second transistor having the base electrode thereof resistively connected to said first circuit point and the collector electrode thereof directly coupled to the base electrode of said third transistor, a first resistive element connected between the base electrode and the emitter electrode of said third transistor, second and third circuit points connected to the emitter electrodes of said first and second transistors respectively, second and third resistive elements connected on one side to said second and third circuit points respectively and on the other side to said common voltage reference, an amplifier stage including a transistor of said second conductivity type and resistive means connecting the base electrode to the emitter electrode thereof, first and second pluralities of said amplifier stage each connected in cascade arrangement with the emitter electrode of each of said stages of said pluralities being directly coupled to the base electrode of the succeeding one of said stages, said first and second pluralities having the base electrode of the initial one of said stages thereof coupled to the collector electrode of said first and third transistors respectively, said first plurality of stages having the collector electrodes thereof connected to said second circuit point, the emitter electrode of the final one of said second plurality of stages being coupled to said third circuit point, a fourth circuit point, load circuit means connected between said fourth circuit point and said common voltage reference, first and second power source means connected on one side to said fourth circuit point, said first power source means being connected on the other side thereof to the emitter electrode of the final one of said stages of said first plurality, the other side of said second power source being commonly connected to the emitter electrode of said third transistor and the collector electrodes of said stages of said second plurality, first and second bias circuit means for supplying operating bias potential for said first and second transistors respectively, and fourth and fifth resistive elements for coupling said operating bias to said first and second transistors respectively, said first and second bias circuit means being coupled and arranged for providing feedback paths from said fourth circuit point to the inputs of said first and second driver sections respectively through said fourth and fifth resistive elements, whereby input signals of a first polarity will be amplified and introduced to said load circuit means predominantly by said first driver section and said first plurality of amplifier stages while input signals of a second polarity will be amplified and introduced to said load circuit means predominantly by said second driver section and said second plurality of amplifier stages.

10. An amplifier in accordance with claim 9 wherein said third transistor and said amplifier stage each includes at least one stabistor in the emitter circuit thereof.

11. An amplifier in accordance with claim 9 wherein said first and second bias circuit means are connected directly across said first and second power source means, and wherein the resistances of said second and third resistive elements are substantially equal, and the resistances of said fourth and fifth resistive elements are substantially equal, the current gain and the voltage gain being substantially defined by $$G_i=\frac{R_{fb}}{R_l}$$

and $$G_v=\frac{R_l}{R_{vb}}$$

respectively, where:

$R_{fb}$=a resistance equivalent in magnitude to the resistance of either said fourth or fifth resistive elements,
$R_l$=the resistance of said load circuit means,
$R_{vb}$=a resistance equivalent in magnitude to the resistance of either said second or third resistive element.

References Cited in the file of this patent

UNITED STATES PATENTS 2,860,193 Lindsay ---------------- Nov. 11, 1958

OTHER REFERENCES

CBS, "Transistorized 6-watt Hi-Fi," Radio-Electronics, August 1957, page 108.

Lin: "Quasi-Complementary Transistor Amplifier, Electronics, September 1956, pages 173–175.

Langford-Smith: "Radiotron Designer's Handbook," pages 311, 312, 315, 1952 edition.